United States Patent [19]
Ducharme et al.

[11] Patent Number: 6,049,297
[45] Date of Patent: Apr. 11, 2000

[54] DIGITAL PHASE MEASURING SYSTEM AND METHOD

[75] Inventors: Alfred D. Ducharme, Tewksbury; Peter N. Baum, Chelmsford, both of Mass.

[73] Assignee: Visidyne, Corp., Burlington, Mass.

[21] Appl. No.: 09/196,016

[22] Filed: Nov. 19, 1998

[51] Int. Cl.[7] ............................................. H03M 1/48
[52] U.S. Cl. ............................ 341/111; 341/155; 327/2; 327/3; 327/9
[58] Field of Search ........................... 341/111, 155; 327/3, 2, 9

[56] References Cited

U.S. PATENT DOCUMENTS

| | | | |
|---|---|---|---|
| 3,956,623 | 5/1976 | Clark et al. | 235/186 |
| 4,246,497 | 1/1981 | Lawson et al. | 307/232 |
| 4,419,624 | 12/1983 | Brown | 324/83 |
| 4,636,719 | 1/1987 | Zuk et al. | 324/83 |
| 4,686,484 | 8/1987 | Otani | 329/109 |
| 5,521,548 | 5/1996 | Sugawara | 329/306 |
| 5,723,989 | 3/1998 | Steinlechner | 327/3 |
| 5,808,895 | 9/1998 | Ibrahim et al. | 364/484 |
| 5,867,693 | 2/1999 | Wang et al. | 395/55 |
| 5,960,044 | 9/1999 | Montreuil | 375/322 |
| 5,970,101 | 10/1999 | Park | 375/329 |

Primary Examiner—Brian Young
Assistant Examiner—Jason Kost
Attorney, Agent, or Firm—Iandiorio & Teska; Brian J. Colandreo

[57] ABSTRACT

A digital phase measuring system and method for measuring the phase difference between two signals including generating quadrature clock signals for a first reference signal, converting a second measured signal from analog to digital form by sampling the second measured signal using the quadrature clock signals to produce quadrature cartesian samples of the measured signal, and converting the quadrature cartesian samples to polar coordinates to define the polar phase coordinate representative of the phase difference between the two signals.

11 Claims, 4 Drawing Sheets

DIGITAL PHASE MEASURING SYSTEM AND METHOD

FIELD OF INVENTION

This invention relates to a digital phase measuring system and method and more particularly to such a system and method in which a first signal is used to clock quadrature samples of a second signal, where these samples are converted from cartesian to polar values to directly obtain the phase of the second signal in relation to the first.

BACKGROUND OF INVENTION

Phase measuring devices are used to determine the phase difference between two signals, normally a reference signal and a signal being measured. Traditionally, these devices have been large, bulky analog circuits which have a high level of complexity and incorporate a large number of components.

Since the phase of the output of all analog components is a function of the amplitude of the signal applied to the component, any change in the amplitude of the signal applied to the component changes the phase of the output signal itself. This is quite troublesome in a system designed to determine distance via accurate phase measurement.

Due to the number of components required to construct one of these analog systems, they tend to be quite expensive and consume i high level of power. Further, due to its internal analog electronics, the output signal of these devices is not easily interfaced with today's digital equipment. Additionally, due to the inaccuracy of the analog components used to construct these devices, the smallest unit of phase shift these devices are usually capable of measuring is 1°.

In an attempt to improve these analog devices, a digital output stage was attached to the analog phase measuring device. However, this only increased the number of components required to produce such a device and, additionally, increased the power consumption and cost of such devices. Unfortunately, this modification did not greatly enhance the accuracy of the device, as the smallest unit of phase shift measurable was only reduced to 0.1°.

In the advent of the personal computer, purely digital phase measurement systems were created. These devices typically incorporate a two channel analog to digital converter card which is installed in a personal computer. The two signals (the reference signal and the measured signal) are fed into the analog to digital converter card and the microprocessor of the personal computer runs a program which determines the phase difference between the two signals. While this device is purely digital, its data processing rate is typically limited to only 100 kilohertz. Additionally, these devices are very large and bulky, consume a high level of power, and are not easily moved from site to site. As with the analog systems previously disclosed, this purely digital system is unable to unambiguously determine phase shift when the phase shift exceeds 359.999°.

SUMMARY OF INVENTION

It is therefore an object of this invention to provide such an improved digital phase measuring system and method.

It is a further object of this invention to provide such a system and method whose phase measurement is independent of amplitude.

It is a further object of this invention to provide such a system and method which employs fewer and simpler components resulting in lower cost and higher processing speeds.

It is a further object of this invention to provide such a system and method which requires only a single analog to digital converter which increases system precision and reduces system error.

It is a further object of this invention to provide such a system and method which uses more hardware/firmware and less software, resulting in higher processing speeds.

It is a further object of this invention to provide such a system and method which processes data at a higher rate of speed and improves system precision through averaging.

This invention results from the realization that a higher speed, simpler and more precise digital phase measuring system can be achieved by generating a quadrature clock signal from a first reference signal and using that clock signal to produce quadrature cartesian samples of a second measured signal and then converting these quadrature cartesian samples to polar coordinates in which the polar phase coordinate represents the phase difference between the two signals.

This invention results from the further realization that by selecting that the cartesian samples are taken in quadrature, the X and Y axes of the cartesian grid coincide with the polar axes of the polar grid, enabling the direct plotting of cartesian samples on a polar grid and direct determination of the phase difference, θ, between the two signals.

This invention features a digital phase measuring system including: a quadrature clock generator circuit, responsive to a first reference signal, for producing a plurality of quadrature clock signals; an analog to digital converter, responsive to the quadrature clock signals, for sampling a second measured signal to produce quadrature cartesian samples of the measured signal; and a cartesian to polar coordinate converter circuit, responsive to the quadrature cartesian samples, for defining the polar phase coordinate representative of the phase difference between the signals.

In a preferred embodiment, the cartesian to polar coordinate converter circuit may define the polar radius coordinate representative of the amplitude of the measured signal. The quadrature clock generator circuit may include a frequency multiplier circuit and a timing generator. The frequency multiplier circuit may multiply the frequency of the reference signal by a factor of four. The timing generator may provide clock signals at 90° intervals. The coordinate converter circuit may include a latch circuit for storing the quadrature cartesian samples. The coordinate convener circuit may include a binary-to-sign/magnitude converter. The digital phase measuring system may include an integer phase cycle controller for monitoring the number of integer phase cycles in the phase difference between the signals. The digital phase measuring system may include an averaging circuit for averaging the phase difference between the signals over a number of samples.

This invention also features a method for digitally measuring the phase difference between two signals comprising the steps of: generating quadrature clock signals from the first of two signals; converting the second of the two signals from an analog to a digital form and sampling the digital output using the quadrature clock signals to produce quadrature cartesian samples of the digitized second signal; and converting the quadrature cartesian samples to polar coordinates for defining the polar phase coordinate representative of the phase difference between the two signals.

In a preferred embodiment, the method of digitally measuring the phase difference between two signals may include the step of averaging the phase difference between the two signals over a number of samples.

DISCLOSURE OF PREFERRED EMBODIMENT

Other objects, features and advantages will occur to those skilled in the art from the following description of a preferred embodiment and the accompanying drawings, in which.

Figure 1:
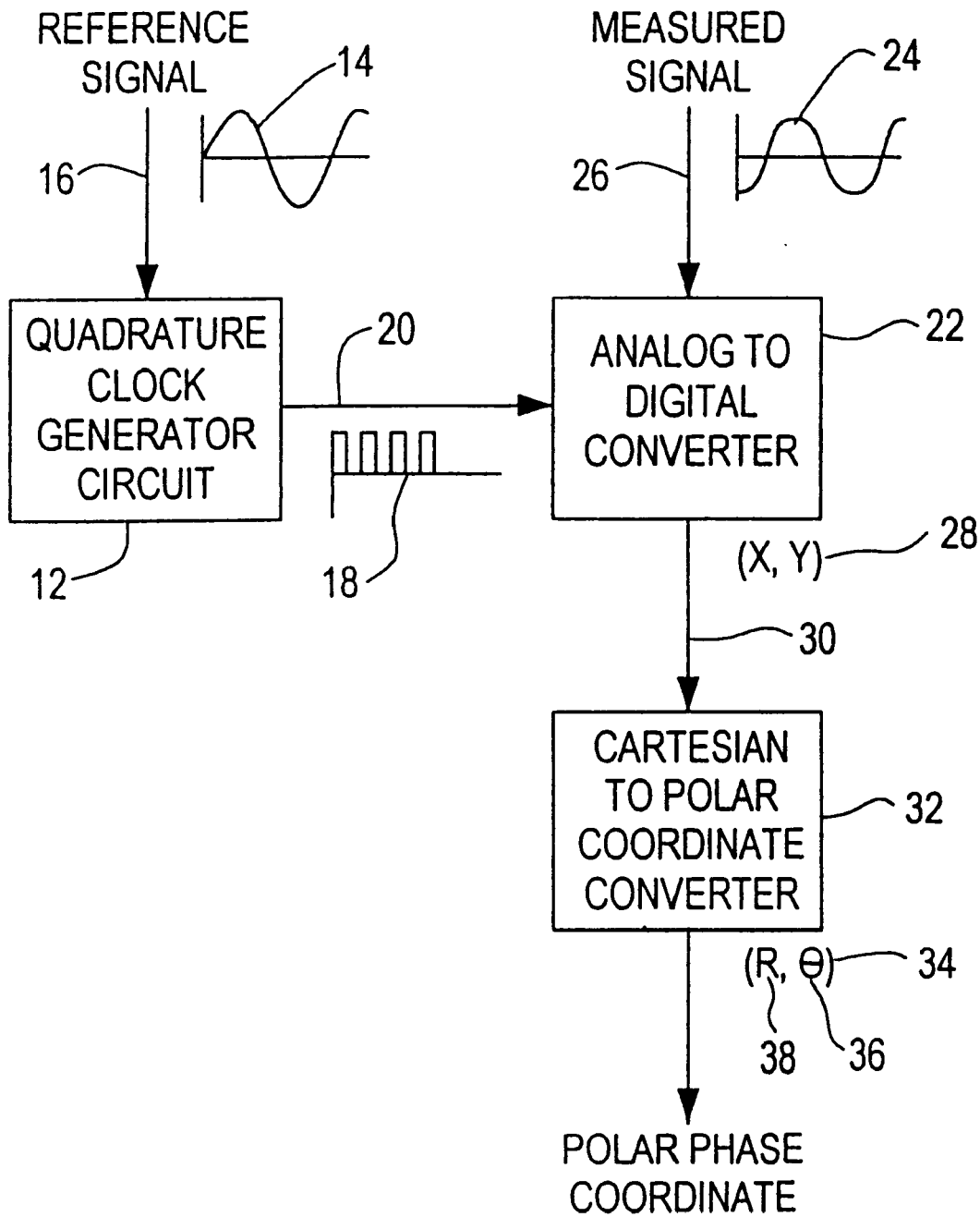
FIG. 1 is a diagrammatic view of the digital phase measuring system according to this invention.

In accordance with this invention, the digital phase measuring system 10, FIG. 1, includes a quadrature clock circuit 12, responsive to a first reference signal 14 at input 16, for producing quadrature clock signals 18 on line 20. Analog to digital converter 22, responsive to quadrature clock signals 18, samples a second measured signal 24 on input 26 to produce quadrature cartesian samples 28 on line 30 of measured signal 24. A cartesian to polar coordinate converter circuit 32, responsive to quadrature cartesian samples 28, generates polar coordinate 34. Polar coordinate 34 includes polar phase coordinate 36 which represents the phase difference between reference signal 14 and measured signal 24. Additionally, polar coordinate 34, as produced by cartesian to polar coordinate converter circuit 32, includes polar radius coordinate 38 which represents the amplitude of measured signal 24.

Figure 2:
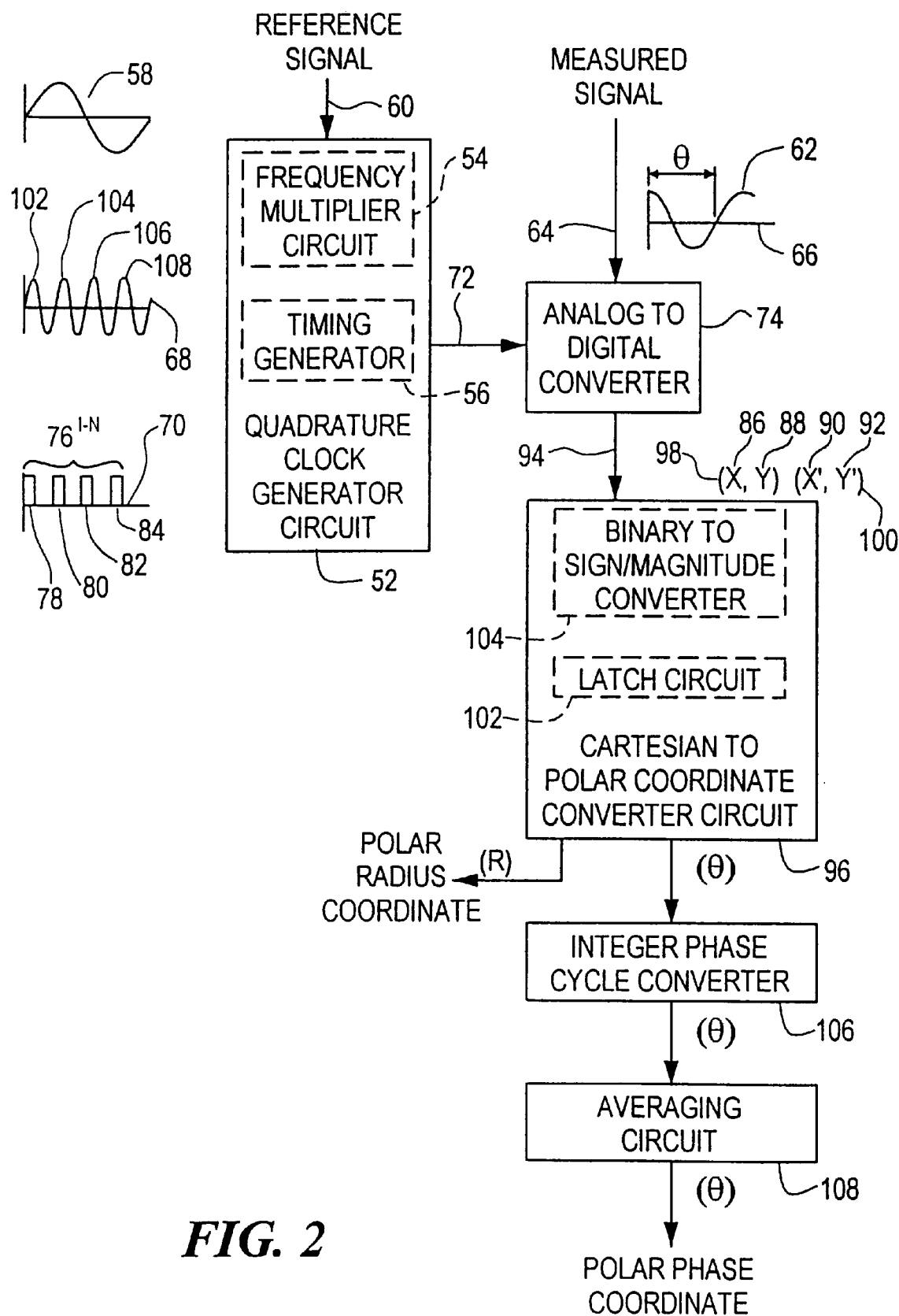
FIG. 2 is a more detailed diagrammatic view of the digital phase measuring system according to this invention including an integer phase cycle converter and an averaging circuit.

In one embodiment phase measuring system 50, FIG. 2 includes a quadrature clock generator circuit 52 containing a frequency multiplier circuit 54 and a timing generator 56. While reference signal 58 on line 60 and measured signal 62 on line 64 have the same frequency, there is a phase shift, θ, which shifts measured signal 62 with respect to reference signal 58 along time axis 66. Digital phase measuring system 50 is used to determine this phase shift, θ.

Frequency multiplier circuit 54 multiplies reference signal 58 by a factor of four (or any other multiple of four; e.g. 8, 12, 16, etc.) to produce quadrature reference signal 68. Timing generator 56, responsive to quadrature reference signal 68, produces quadrature clock signal 70 on line 72.

Quadrature clock signal 70 and measured signal 62 are provided to digital to analog converter 74 which samples measured signal 62 in accordance with a sampling rate controlled by quadrature clock signal 70. Each quadrature clock signal 70 includes a plurality of individual clock pulses $76_{1-n}$. Each one of these clock pulses $76_{1-n}$ present in quadrature clock signal 70 causes analog to digital converter 74 to take one sample of measured signal 62 at an interval defined by the frequency of clock pulses $76_{1-n}$ present in quadrature clock signal 70.

Specifically, for this particular example, quadrature clock signal 70 has four clock pulses 78, 80, 82 and 84. Each one of these clock pulses causes analog to digital converter 74 to sample measured signal 62. Analog to digital converter 74 then generates four samples 86, 88, 90 and 92 on line 94 which are provided to cartesian to polar coordinate converter circuit 96. These samples 86, 88, 90 and 92 generated by analog to digital converter 74 are arranged in pairs in two groups 98 and 100. Each of these groups 98, 100 is a set of cartesian coordinates, where the first element represents movement along the X axis and the second element represents movement along the Y axis.

These four samples 86, 88, 90 and 92 are configurable into cartesian coordinates 98 and 100 since reference signal 58 is multiplied by a multiplier which is a factor of four. This generates, in this particular example, quadrature reference signal 68 where each period 102, 104, 106, and 108 of quadrature reference signal 68 has a frequency which is four times (or a multiple thereof) that of original reference signal 58. Therefore, the individual periods of quadrature reference signal 68 are only one quarter the length of reference signal 58. Accordingly, each period 102, 104, 106 and 108 of quadrature reference signal 68 corresponds to only one quarter of a period (or 90°) of reference signal 58. By selecting that the cartesian samples are taken in quadrature, the X and Y axes of the cartesian grid coincide with the polar axes of the polar grid. Therefore, this enables the direct plotting of cartesian samples on a polar grid, thus enabling direct determination of the phase difference, θ, between the two signals.

Since quadrature reference signal 68 is used to generate quadrature clock signal 70, which controls the sampling rate of analog to digital converter 74, measured signal 62 is sampled every 90° (or four times per period). This in turn generates, for each quadrature clock signal 70, four digital samples 86, 88, 90 and 92 (all sampled 90° apart) which are used to generate cartesian coordinates 98 and 100.

Cartesian to polar coordinate converter circuit 96 converts cartesian coordinates, which consist of two elements representing two-dimensional movement, to polar coordinates which consist of two elements representing an angular displacement and a radial distance along the angle defined by the angular displacement. Since samples 86, 88, 90 and 92 are all taken at 90° intervals along measured signal 62, cartesian coordinate 100 is a mirror image of cartesian coordinate 98. Therefore, cartesian to polar coordinate converter circuit 96 can determine the phase shift between reference signal 58 and measured signal 62 through the use of either cartesian coordinate 98 or cartesian coordinate 100. Cartesian to polar coordinate converter circuit 96 uses first cartesian coordinate 98 (comprising samples 86 and 88) to determine the phase shift between reference signal 58 and measured signal 62.

Cartesian to polar coordinate converter circuit 96 includes a latch circuit 102 for storing cartesian coordinate 98. Depending on the cartesian to polar coordinate converter circuit 96 utilized in digital phase measuring system 50, a binary-to-sign/magnitude converter 104 may be required. Specifically, a binary-to-sign/magnitude converter converts an unsigned binary signal of "n" bits to a signed binary signal of "n−1" bits. A typical embodiment of cartesian to polar coordinate converter circuit 96 is a Raytheon TMC2330A coordinate transformer, which requires binary-to-sign/magnitude converter 104.

During use, cartesian to polar coordinate converter circuit 96 converts a cartesian coordinate 98, comprising two elements representing displacement along the abscissa (X) and ordinate (Y) to a polar coordinate, comprising two elements representing angular displacement (θ) about the origin of the XY axis and linear displacement (r) from the origin. This angular displacement (or polar phase) θ corresponds to the phase shift between reference signal 58 and measured signal 62.

Since it is possible for measured signal 62 to be out of phase with reference signal 58 by more than one period (or 360°), digital phase measuring system 50 includes an integer phase cycle converter 106 which monitors the number of complete periods (or units of 360° phase shift) in which reference signal 58 is phase shifted in relation to measured signal 62.

Averaging circuit 108 is included to average the total phase shift, comprising the integer phase shift (360° phase shift) from integer phase cycle converter 106 and the fractional phase shift (or polar phase), θ, from cartesian to polar coordinate converter circuit 96, to generate an averaged polar phase coordinate. This average is taken over a predetermined and user defined number of samples. The linear displacement (or polar radius) r represents the magnitude of measured signal 62.

Figure 3:
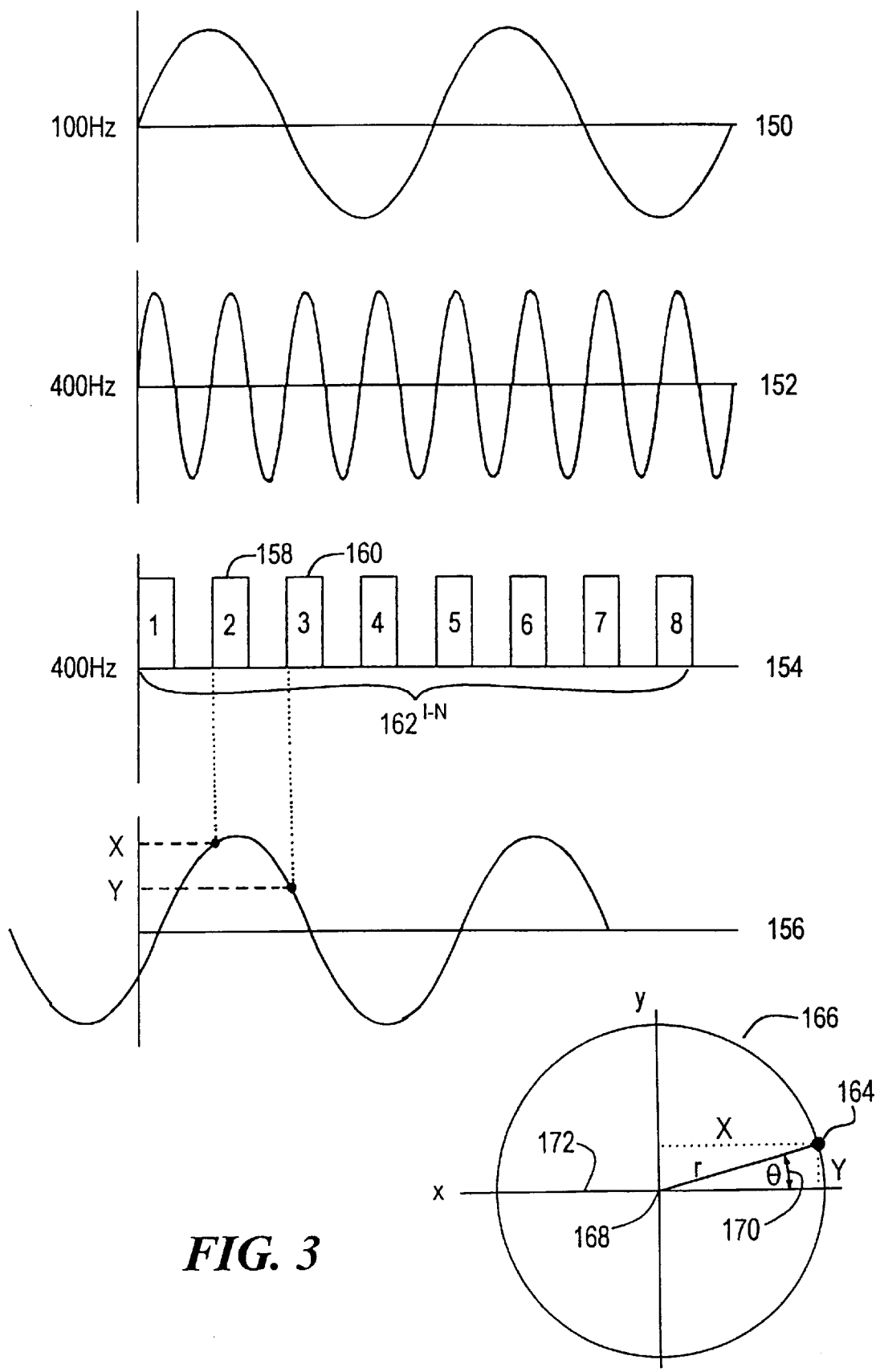
FIG. 3 is a plan view of the waveforms of the measured and reference signals as they propagate through the digital phase measuring system according to this invention.

During operation of digital phase measuring system 50, reference signal 150, FIG. 3, is introduced to a frequency multiplier circuit which multiplies reference signal 150 to a frequency which is a multiple of four times greater than that of reference signal 150. For illustrative purposes only, reference signal 150 is multiplied by a factor of four to generate quadrature reference signal 152. Assuming, for illustrative purposes only, that reference signal 150 has a frequency of 100 Hz, quadrature reference signal 152 would have a frequency of 400 Hz. A timing generator circuit then conditions quadrature reference signal 152 into quadrature clock signal 154. Quadrature clock signal 154 has the same frequency as quadrature reference signal 152 (in this example, 400 Hz) and the sinusoid of quadrature reference signal 152 is converted into a series of clock pulses in quadrature clock signal 154.

Quadrature clock signal 154 is used as a sampling clock for an analog to digital converter which samples measured signal 156 at specific points defined by quadrature clock signal 154. In this particular example, the second and third clock pulses, namely 158 and 160 of quadrature clock signal 154 are used to sample measured signal 156 resulting in two sample points being generated, X and Y. It is important to note that any of the individual clock pulses $162_{1-n}$ making up quadrature clock signal 154 can be used to sample measured signal 156 as long as the two samples are not 180° (or multiples thereof) apart from each other. Therefore, samples 1 and 2 (90° apart), samples 2 and 3 (90° apart), samples 1 and 4 (270° apart) and samples 1 and 6 (450° apart) can be used. However, samples 1 and 3 (180° apart), samples 2 and 6 (360° apart) and samples 1 and 7 (540° apart) cannot be used.

The cartesian coordinate generated represents: first, a displacement along the X axis; and, second, a displacement along the Y axis. The point 164 generated by plotting the cartesian coordinate (X,Y) on cartesian grid 166 is converted to a polar coordinate through the use of a cartesian to polar coordinate converter circuit. As stated earlier, a polar coordinate comprises two elements: a polar radius (r) which represents a displacement from the origin 168 of the cartesian grid 166; and a polar phase (θ) which represents the angular displacement 170 between the X axis 172 and the polar radius (r). Once this conversion is complete, polar phase coordinate (θ) represents the phase shift between reference signal 150 and measured signal 156. Additionally, polar radius coordinate (r) represents the amplitude of measured signal 156.

Figure 4:
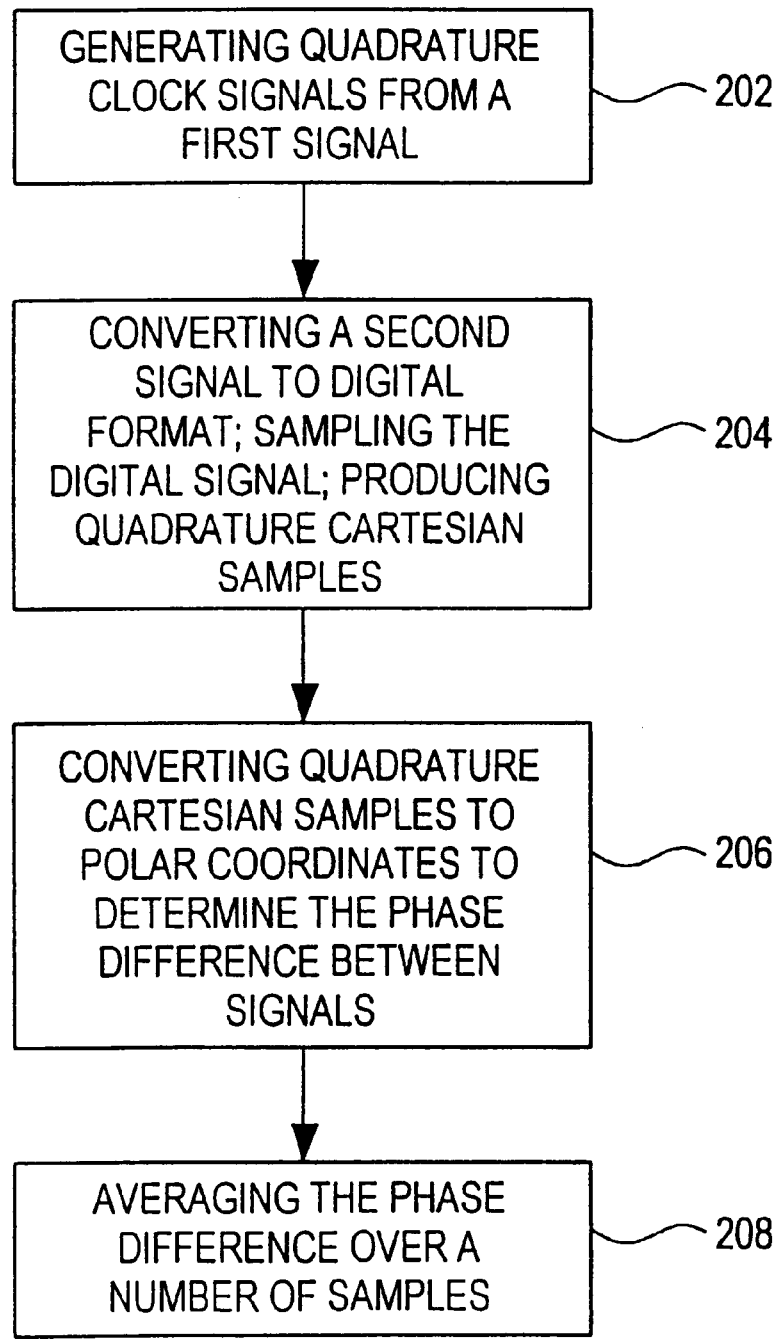
FIG. 4 is a flow chart of the digital phase measuring method according to this invention.

Another embodiment of the digital phase measuring method 200, FIG. 4, includes a method for digitally measuring the phase difference between two signals comprising the steps of: generating 202 quadrature clock signals from the first of two signals; converting 204 the second of two signals from an analog to a digital form and sampling the digital output using the quadrature clock signals to produce quadrature cartesian samples of the digitized second signal; and converting 206 the quadrature cartesian samples to polar coordinates for defining the polar phase coordinate representative of the phase difference between the two signals.

Digital phase measuring method 200 includes the step of averaging 208 the phase difference over a number of samples.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A digital phase measuring system comprising:

a quadrature clock generator circuit, responsive to a first reference signal, for producing a plurality of quadrature clock signals;

an analog to digital converter, responsive to said quadrature clock signals, for sampling a second measured signal to produce quadrature cartesian samples of said measured signal; and a cartesian to polar coordinate converter circuit, responsive to said quadrature cartesian samples, for defining the polar phase coordinate representative of the phase difference between the signals.

2. The digital phase measuring system of claim 1 in which said cartesian to polar coordinate converter circuit defines the polar radius coordinate representative of the amplitude of said measured signal.

3. The digital phase measuring system of claim 1 in which said quadrature clock generator circuit includes a frequency multiplier circuit and a timing generator.

4. The digital phase measuring system of claim 3 in which said frequency multiplier circuit multiplies the frequency of said reference signal by a factor of four.

5. The digital phase measuring system of claim 3 in which said timing generator provides clock signals at 90° intervals.

6. The digital phase measuring system of claim 1 in which said coordinate converter includes a latch circuit for storing said quadrature cartesian samples.

7. The digital phase measuring system of claim 1 in which said coordinate converter circuit includes a binary-to-sign/magnitude converter.

8. The digital phase measuring system of claim 1 further including an integer phase cycle converter for monitoring the number of integer phase cycles in the phase difference between said signals.

9. The digital phase measuring system of claim 1 further including an averaging circuit for averaging the phase difference between said signals over a number of samples.

10. A method of digitally measuring the phase difference between two signals comprising the steps of:

generating quadrature clock signals from the first of two signals;

converting the second of the two signals from an analog to a digital form and sampling this digital output using the quadrature clock signals to produce quadrature cartesian samples of the digitized second signal; and converting the quadrature cartesian samples to polar coordinates for defining the polar phase coordinate representative of the phase difference between the two signals.

11. The method of digitally measuring the phase difference between two signals of claim 10 further including the step of averaging the phase difference between the signals over a number of samples.

* * * * *